(12) United States Patent
Lee

(10) Patent No.: US 6,788,617 B1
(45) Date of Patent: Sep. 7, 2004

(54) DEVICE FOR GENERATING MEMORY ADDRESS AND MOBILE STATION USING THE ADDRESS FOR WRITING/READING DATA

(75) Inventor: Joo Heung Lee, Seoul (KR)

(73) Assignee: LG Information & Communications, Ltd., Seoul (KR)

( * ) Notice: Subject to any disclaimer, the term of this patent is extended or adjusted under 35 U.S.C. 154(b) by 631 days.

(21) Appl. No.: 09/628,500

(22) Filed: Jul. 28, 2000

(30) Foreign Application Priority Data

Jul. 30, 1999 (KR) .................................... P1999-31445

(51) Int. Cl.[7] .............................................. G06F 12/06
(52) U.S. Cl. ................. 365/240; 711/219; 365/230.01; 365/189.01; 365/189.08; 365/189.12; 365/236; 365/230.08
(58) Field of Search ....................... 365/230.01, 189.01, 365/189.08, 189.12, 230.06, 236, 230.08, 240; 711/200, 211, 219

(56) References Cited

U.S. PATENT DOCUMENTS 4,472,732 A * 9/1984 Bennett et al. .............. 348/452
5,081,700 A    1/1992 Crozier
6,236,681 B1 * 5/2001 Varanasi et al. ........ 375/240.15

FOREIGN PATENT DOCUMENTS

| DE | 3829261 A1 |   | 3/1990 |
| DE | 4412610 A1 | * | 10/1995 |
| EP | 0319430 B1 |   | 6/1989 |
| JP | 01307869 A | * | 12/1989 |

* cited by examiner

Primary Examiner—B. James Peikari
(74) Attorney, Agent, or Firm—Fleshner & Kim, LLP

(57) ABSTRACT

A device for generating memory addresses is provided that is suitable for generating memory addresses transposed in row/column directions with reference to a data successively stored therein along with a mobile station by using the same, and a method for writing/reading a data. The device includes a counter that generates $2^{2n}$ successive addresses in 2n bitstreams to provide row direction addresses, and a barrel shifter that shifts the generated 2n bitstreams by 'n' bits to provide column direction addresses. Thus, circuitry of a picture encoder of the mobile station or of an interleaver in a mobile communication system is reduced, and a faster operation speed is obtained.

12 Claims, 10 Drawing Sheets entire memory order of picture data output

|   |   |   |   |   |   |   |   |
|---|---|---|---|---|---|---|---|
| 0 | 1 | 2 | 3 | 4 | 5 | 6 | 7 |
| 8 | 9 | 10 | 11 | 12 | 13 | 14 | 15 |
| 16 | 17 | 18 | 19 | 20 | 21 | 22 | 23 |
| 24 | 25 | 26 | 27 | 28 | 29 | 30 | 31 |
| 32 | 33 | 34 | 35 | 36 | 37 | 38 | 39 |
| 40 | 41 | 42 | 43 | 44 | 45 | 46 | 47 |
| 48 | 49 | 50 | 51 | 52 | 53 | 54 | 55 |
| 56 | 57 | 58 | 59 | 60 | 61 | 62 | 63 | width = $2^n$, height = $2^n$ n=3 case

DEVICE FOR GENERATING MEMORY ADDRESS AND MOBILE STATION USING THE ADDRESS FOR WRITING/READING DATA

BACKGROUND OF THE INVENTION

1. Field of the Invention

The present invention relates to a transposing memory, and more particularly, to a device that generates memory addresses.

2. Background of the Related Art

A transposing memory is used in an encoder, decoder, or an interleaver in a mobile communication system. For a mobile station having a picture transmission function, the encoder encodes a picture data for transmission of the picture to an opposite party, and the decoder receives and decodes the encoded picture data into an original picture data. The interleaver is provided for minimizing a burst error of the data transmitted in a CDMA type communication system.

The encoder and decoder of the mobile station will now be described. FIG. 1 illustrates a block diagram showing a part of a related art encoder.

As shown in FIG. 1, the related art encoder is provided with a 2D DCT part 100 for receiving, and twice subjecting a picture data to Discrete Cosine Transform (DCT), a quantizing part 110 for receiving and quantizing the picture data from the DCT part 100, and a zigzag scanning block 120 for scanning DC and AC components of the picture data quantized at the quantizing part 110 in a zigzag for encoding the DC and the AC components. A Variable Length Coding (VLC) part 130 is for assigning codes of short lengths to symbols with a high frequency of occurrences in view of probability, and assigning codes of long lengths to symbols with a low frequency of occurrences. A channel buffer 140 buffers the encoded picture data. An inverse quantizing part 150 is for subjecting the DCT data from the quantizing part 110 to inverse quantizing, and a 2D IDCT part 160 is for twice subjecting the DCT data from the inverse quantizing part 150 to Inverse Discrete Cosine Transform (IDCT).

The 2D DCT part 100 is provided with a first DCT 101 for receiving and subjecting the picture data to DCT, a transposing memory 102 for storing the DCT picture data in a row direction and presenting in a column direction and a second DCT 103 for subjecting the data from the transposing memory 102 to DCT. A row direction address generator 104 generates a writing address of the transposing memory 102, and a column direction address generator 105 generates a reading address of the transposing memory 102.

The 2D IDCT part 160 is provided with a first IDCT 163 for receiving and subjecting the DCT data from the inverse quantizing part 150 to IDCT, a transposing memory 162 for temporary storing the IDCT data in the row direction and presenting in a column direction and a second IDCT 161 for subjecting the data from the transposing memory 162 to IDCT. A row direction address generator 164 generates a writing address of the transposing memory 162, and a column direction address generator 165 generates a reading address of the transposing memory 162. The zigzag scanning block 120 is provided with a zigzag scanning part 121 for zigzag scanning the quantized data. A column direction address generator 122 and a zigzag address generator 123 provide a scanning and an output address to the zigzag scanning part 121, respectively. A detailed description of the decoder will be omitted here as the decoder has a system opposite to the encoder.

The operation of the related art encoder will now be described. The picture data has a high correlation between adjacent data. Therefore, a two dimensional data operation, such as DCT, is processed by twice performing a one dimensional operation using orthogonal transform characteristics. Thus, the data subjected to a first one dimensional operation at the first DCT 101 is stored in the transposing memory 102 according to the writing address generated in the row direction at the row direction address generator 104. The data stored in the row direction in the transposing memory 102 is presented by the reading address generated in the column direction at the column direction address generator 105 and subjected to a one dimensional operation for the second time at the second DCT 103. The foregoing process is applicable to the IDCT process, except that the data is stored according to a writing address generated in the row direction at the transposing memory 162 in the 2D IDCT part 160, and presented in the column direction according to a reading address generated in the column direction. In the meantime, the data is provided to the zigzag scanning part 121 according to the column direction writing address provided from the column direction address generator 122. States of the picture data input to/output from the transposing memory 102 are shown in FIGS. 2A and 2B, respectively.

The column direction address generator in the related art encoder will now be described. FIG. 3 illustrates row/column direction address generators shown in FIG. 1.

As shown in FIG. 3, since the data from the transposing memory 102 or 162 has a transposed matrix, the column direction address generator is required to provide the reading address for presenting the data stored in the transposing memory 102 and 162. Therefore, the column direction address generator 105 or 164 is provided with a first counter 300 for providing an $2^n$ (i.e., 0, 1, 2, 3, 4, 5, 6, 7 when n=3) by up counting a pulse signal every time the pulse signal is provided to an enable terminal. An initial value generator 310 takes a new value from the first counter 300 as an initial value every time the new value is provided from the first counter 300. A second counter 330 is for repeatedly counting $2^n$ to generate a carry out signal whenever the count is $2^n$, and provide the carry out signal to the first counter 300 and the initial value generator 310 as an enable signal. Further, a step sizer 340 always provides $2^n$, and an accumulator 320 accumulates the $2^n$ value from the step sizer 340 for $2^n$ times using the signal from the initial value generator 310 as an initial value and then forwards the accumulated value.

The operation of the column direction address generator will now be described. As shown in FIG. 4, it is assumed that the transposing memory 102 or 162 is a square of $2^n \times 2^n$. Thus, when the first counter 300, the second counter 330, and the initial value generator 310 are initialized, the first counter 300 provides '0' so that the initial value generator 310 initializes the accumulator 320 at '0' for the accumulator 320 to provide an address of '0'. Next, the accumulator 320 adds the $2^n$ from the step sizer 340 to provide $2^n$. The accumulator 320 keeps adding $2^n$ from the step sizer 340 in succession to provide repeatedly accumulated $2^n$ values ($2 \times 2^n$, $3 \times 2^n$, $4 \times 2^n$, $5 \times 2^n$, $6 \times 2^n$, - - - , $2^{2n}-2^n$) as addresses of a first column of the transposing memory 102. Then, the second counter 330, which provides a number of repetitions generates a carry out, and the first counter 300 is enabled by the carry out to provide '1', and the initial value generator 310 initializes the accumulator 320 at '1'. Accordingly, the accumulator 320 provides '1', and then the $2^n$ from the step sizer 340 is repeatedly added to the '1' from the accumulator 320 for $2^n$ times to provide addresses of the second column ('1',1+$2^n$, 1+2×$2^n$, 1+3×$2^n$, 1+4×$2^n$, 1+5×$2^n$, 1+6×$2^n$, - - -, 1+$2^{2n}$−$2^n$). In the same manner, the first counter 300 provides 2, 3, 4, 5, 6, and 7, and the accumulator repeatedly accumulates the $2^n$ from the step sizer 340 for $2^n$ times whenever the first counter 300 provides the 2, 3, 4, 5, 6, and 7. Thus, the column direction address generator can generate column direction reading addresses for all columns of the $2^n \times 2^n$ transposing memory.

As described above, however, the related art encoder has various problems in the column direction address generator. First, the two counters and two accumulators in the related art column direction address generator make the hardware complicated, which is difficult (e.g., increased size, increased cost, increased time, etc.) to fabricate. Further, initialization of each of the counters, the initial value generator, and the accumulator at an appropriate time required for generation of the column direction address generator makes an encoding or decoding rate of the picture data decrease or slow.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

An object of the present invention is to provide a device that generates memory addresses, a mobile station by using the same, and a method for writing/reading a data that substantially obviates one or more of the problems due to limitations and disadvantages of the related art.

Another object of the present invention is to provide a device for generating memory addresses that has reduced size.

Another object of the present invention is to provide a device for generating memory addresses that has reduced cost.

Another object of the present invention is to provide a device for generating memory addresses, which can generate column direction addresses of a transposing memory faster and more efficiently.

Another object of the present invention is to provide a device for generating memory addresses and a method for writing/reading a data, in which column direction addresses and row direction addresses of a transposing memory can be processed in parallel to generate the column direction address and the row direction address on the same time, alternatively.

To achieve at least these objects and other advantages in a whole or in part and in accordance with the purpose of the present invention, as embodied and broadly described, a memory address generator includes a counter that generates $2^{2n}$ addresses in 2n bitstreams in succession to provide row direction addresses, and a barrel shifter that subjects the generated 2n bitstreams to 'n' bit barrel shifting to provide column direction addresses.

To further achieve the above objects in a whole or in part in accordance with the present invention, there is provided a memory address generator including a counter that generates $2^{2n}$ addresses in succession to provide a first 2n bitstream and a second 2n bitstream having the first 2n bitstream shifted by 'n' bits, and a multiplexer that selects one from the first 2n bitstream and the second 2n bitstream in response to a selection signal.

To further achieve the above objects in a whole or in part in accordance with the present invention, there is provided a memory address generator that includes a counter that generates a plurality of addresses with a prescribed number of bits in succession to provide first direction addresses and a shifter that shifts the successive prescribed bit addresses by 'n' bits to provide second direction addresses.

To further achieve the above objects in a whole or in part in accordance with the present invention, there is provided a mobile station for encoding and transmitting a picture data that includes a transposing memory that stores the picture data, a memory writing address generator that alternatively generates writing addresses of the transposing memory in a row direction and in a column direction in response to a first control signal, and a memory reading address generator that alternatively generates reading addresses of the transposing memory in the column direction and in the row direction in response to a second control signal.

To further achieve the above objects in a whole or in part in accordance with the present invention, there is provided a method for transferring data for a transposing memory having a prescribed number of cells that includes storing a first periodic prescribed number of data in a row direction in the transposing memory in succession, reading the first periodic data in a column direction in succession beginning when a preset number of the first periodic data are stored in the row direction, storing a second periodic prescribed number of data in the transposing memory in the column direction in succession, and reading the second periodic data in the row direction in succession.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Reference will now be made in detail to preferred embodiments according to the present invention, examples of which are illustrated in the accompanying drawings. Preferred embodiments according to the present invention disclose a device that generates a memory address being row and/or column direction addresses of a transposing memory having decreased size, increased speed and concurrent dual use, and use thereof in a communication system. Preferred embodiments generate a memory address according to the present invention in a desired direction, (e.g., in a column direction) by shifting a required bitstream, and process a row direction writing address and a column direction reading address in parallel.

Figure 1:
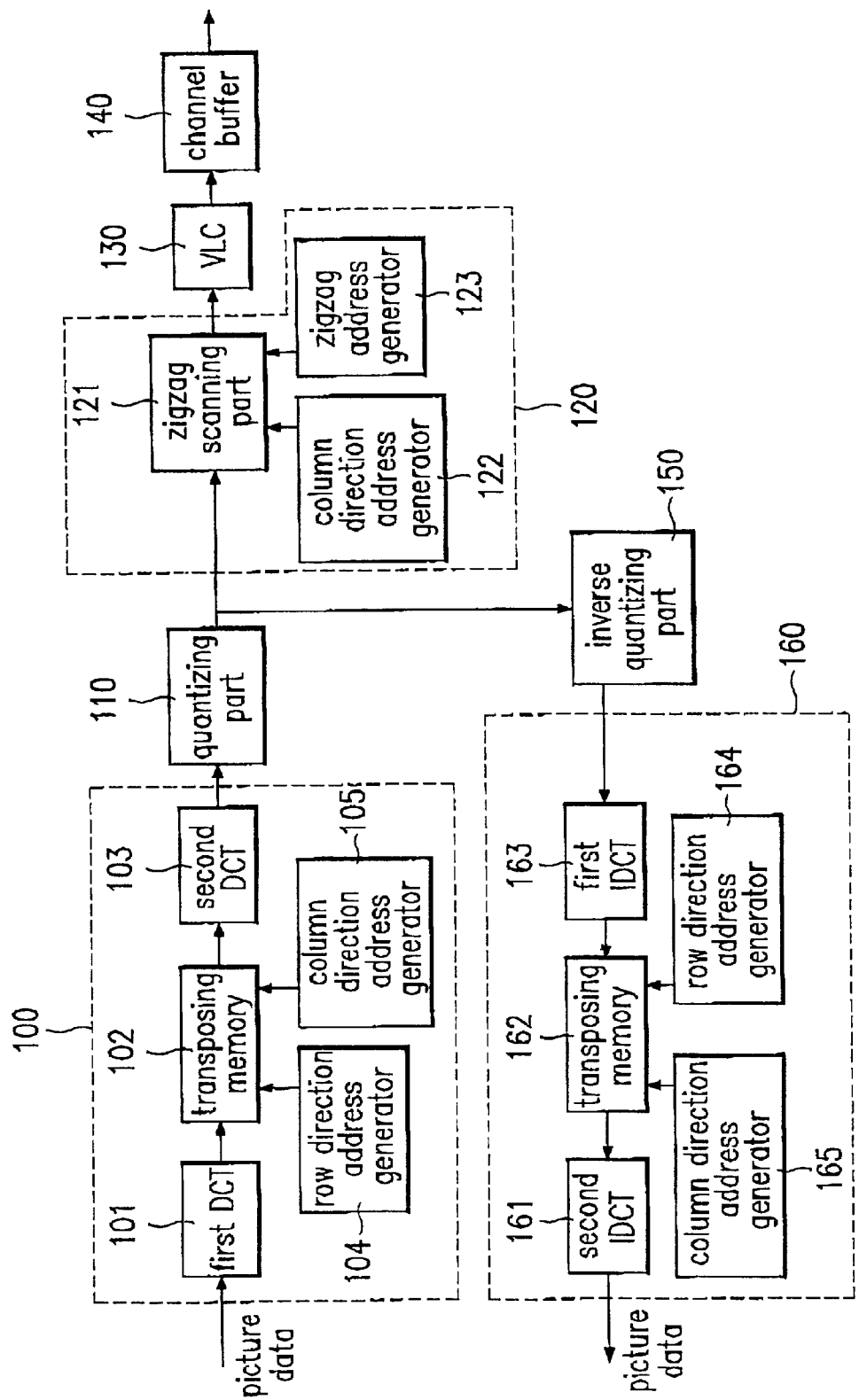
FIG. 1 illustrates a block diagram of a part of a related art encoder that encodes a picture data.
Figure 2A:
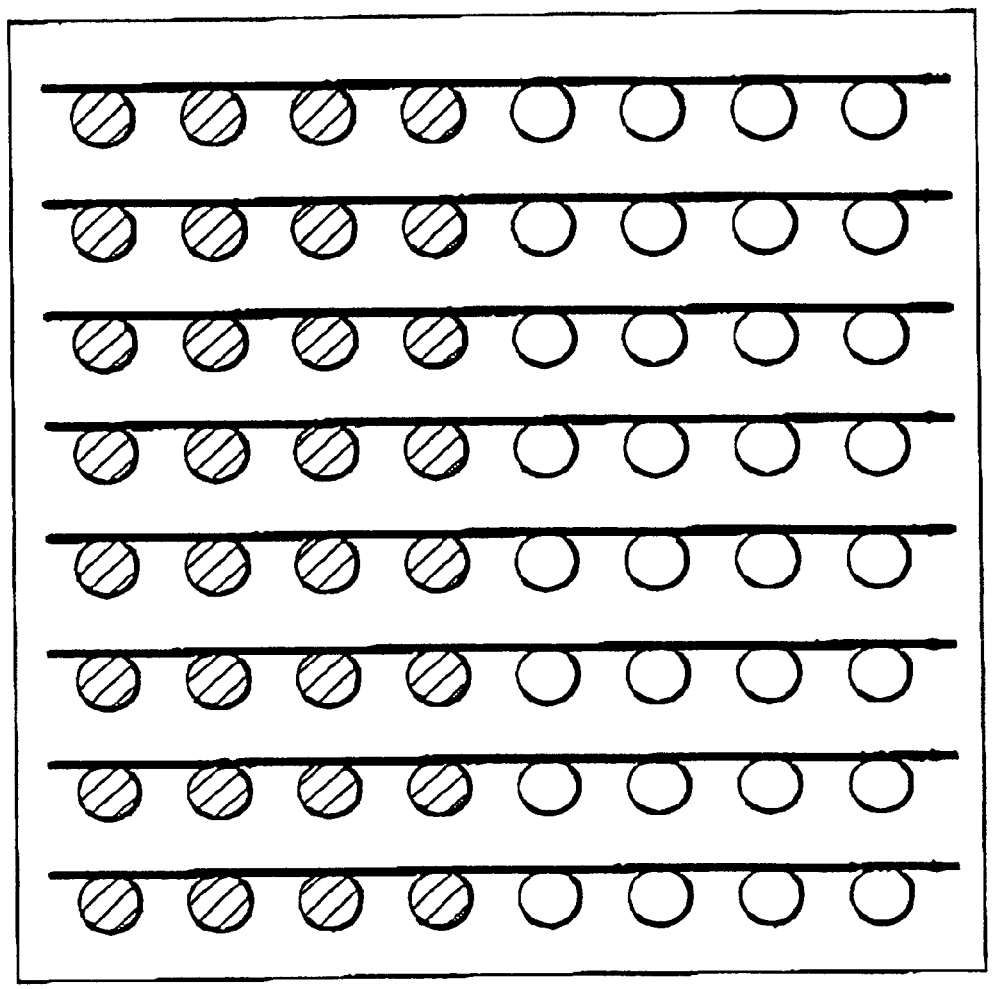
FIGS. 2A and 2B are diagrams that illustrate data writing/reading from the transposing memory in FIG. 1.
Figure 2B:
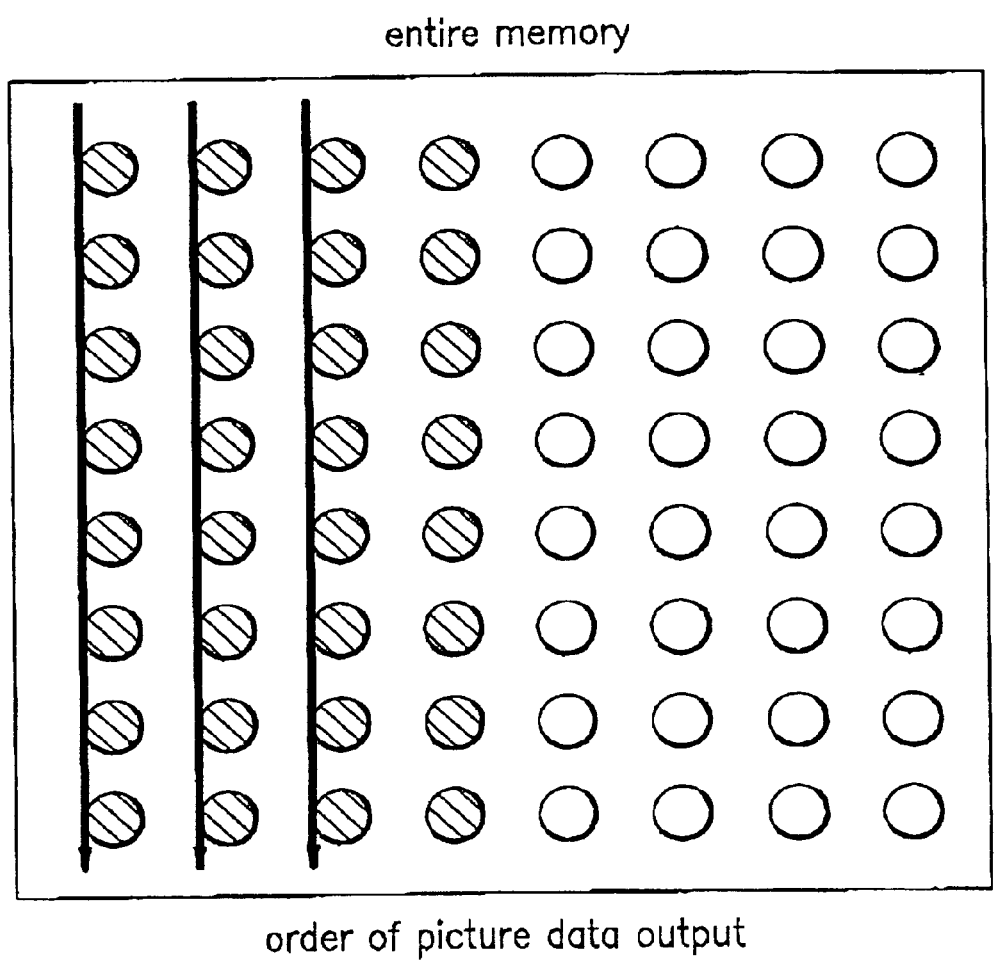
Figure 3:
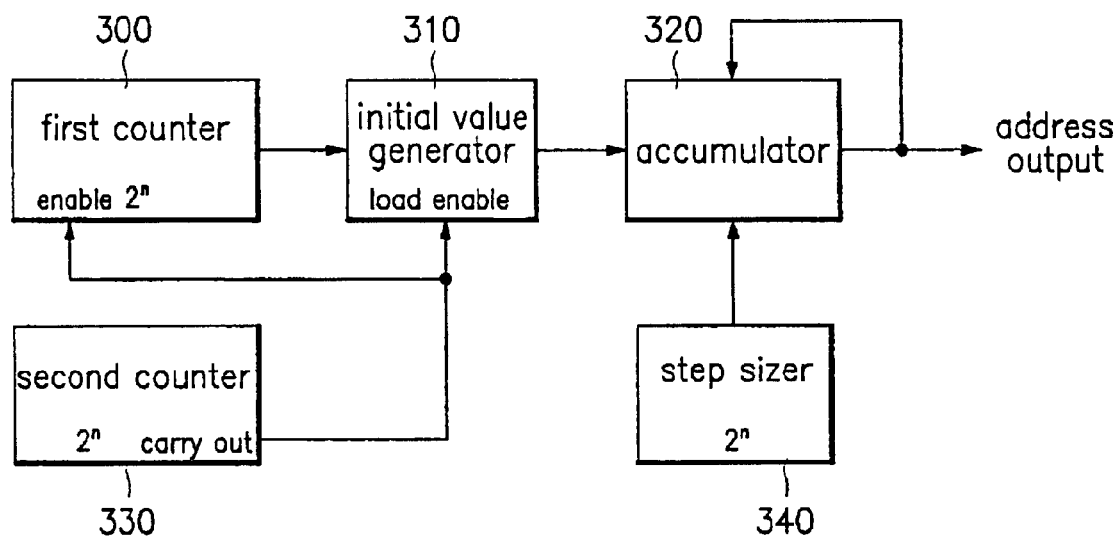
FIG. 3 is a diagram that illustrates a column direction address generator in FIG. 1.
Figure 4:
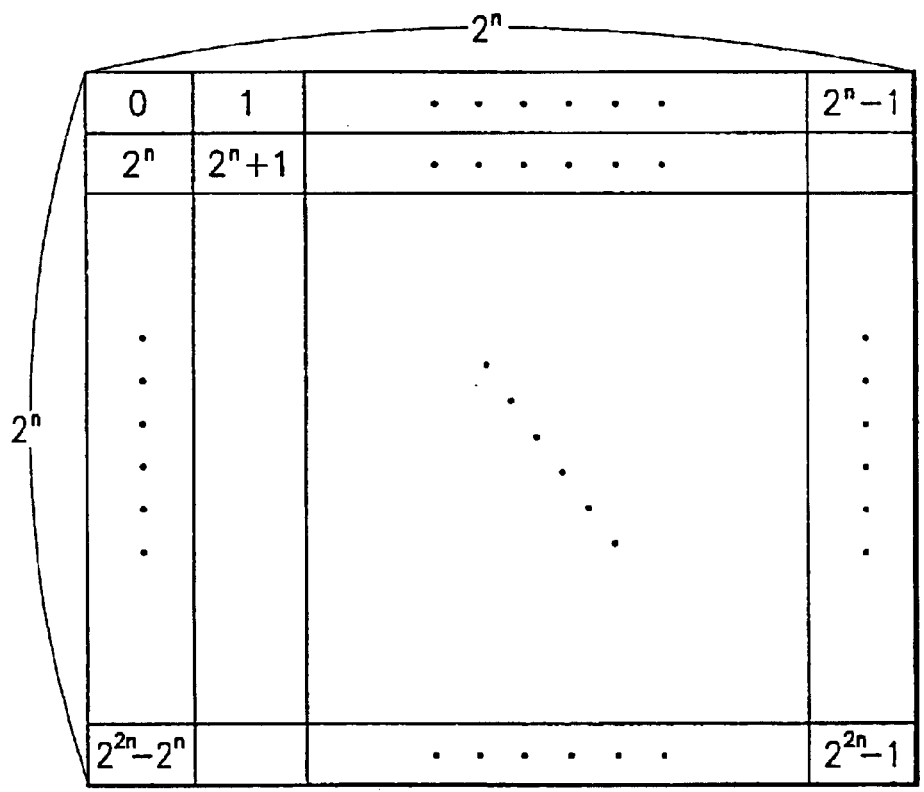
FIG. 4 is a diagram that illustrates addresses of a related art transposing memory.
Figure 5:
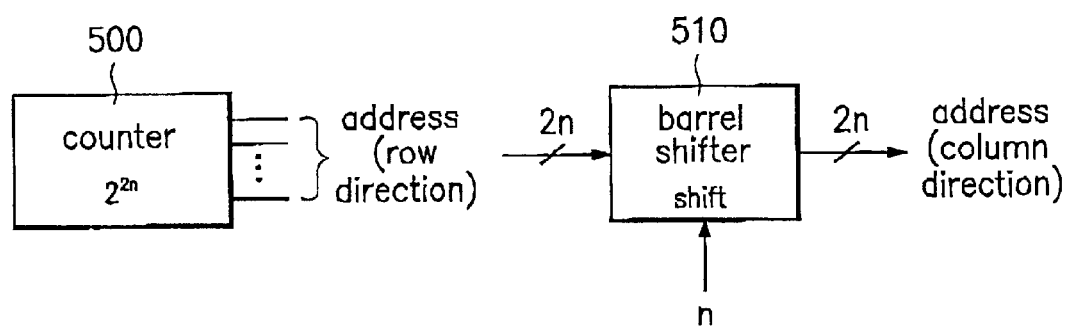
FIG. 5 illustrates a block diagram showing a preferred embodiment of a device that generates a memory address in accordance with the present invention.

FIG. 5 illustrates a block diagram showing a device for generating a memory address in accordance with a first preferred embodiment of the present invention. In the description of preferred embodiments, it is assumed that all the transposing memory described hereafter are squares each with a $2^n \times 2^n$ size. However, the present invention is not intended to be so limited.

As shown in FIG. 5, the device for generating a memory address in accordance with the first preferred embodiment includes a counter 500 for providing $2^{2n}$ kinds of 2n bitstreams, and a barrel shifter 510 for shifting the $2^n$ bitstreams from the counter 500 by 'n' bits. The device for generating a memory address in accordance with the first preferred embodiment of the present invention generates memory reading addresses in a direction (i.e., a column direction) opposite to the direction of the memory writing addresses preferably in succession. Addresses of the transposing memory increasing in the row direction step by step provided from the counter 500 are represented as Addr_row, and addresses of the transposing memory increasing in the column direction step by step provided from the counter 500 are represented as Addr_col. Then, the Addr_row and the Addr_col have a value and correlation as described in equations (1) and (2).

$$\text{Addr\_row} = A_{2n-1}*2^{2n-1} + A_{2n-2}*2^{2n-2} + \cdots + A_1*2^1 + A_0*2^0 \quad (1)$$

$$\text{Addr\_col} = A_{n-1}*2^{2n-1} + \cdots + A_0*2^n + A_{2n-1}*2^{n-1} + \cdots + A_n*2^0 \quad (2)$$

Considering a correlation between the two equations (1) and (2), according to the preferred embodiments the Addr_col can be generated by barrel shifting the Addr_row by 'n' bits.

Figure 6:
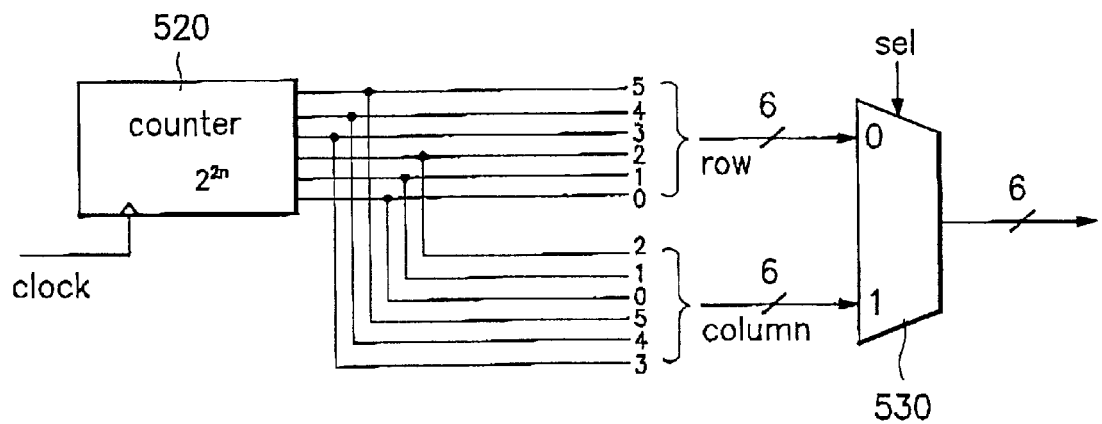
FIG. 6 illustrates a block diagram showing another preferred embodiment of a device that generates a memory address in accordance with the present invention.

FIG. 6 illustrates a block diagram showing a device for generating a memory address in accordance with a second preferred embodiment of the present invention. In the device for generating a memory address in accordance with the second preferred embodiment, a function of the barrel shifter 510 is performed by rearranging bits from the counter 520. That is, the device for generating a memory address in accordance with the second preferred embodiment of the present invention includes a counter 520 for generating a first bitstream of row direction addresses from '0' to $2^n-1$ each with 6 bits in succession, a second bitstream having the 6 bits in the first bitstream shifted by 'n' bits, and a multiplexer 530 for selectively forwarding one of the first and second bitstreams generated at the counter 520. As described "n" is equal to three, however, the present invention is not intended to be so limited. That is, the counter 520 has a first output terminal for forwarding $2^n$ addresses in 2n bitstreams in succession (e.g., a first bitstream), and a second output terminal for changing positions of the most significant 'n' bits and the least significant 'n' bits of the 2n bitstreams (e.g., a second bitstream) and forwarding the 2n bitstreams. The first bitstreams from the counter 520 are preferably the row direction addresses, and the second bitstreams are column direction addresses, and a control signal 'Sel' is provided to the multiplexer 530 for selecting a column direction address. Therefore, if the control signal 'Sel' selects the row direction address, the multiplexer 530 selects a first bitstream of the row direction received from the counter 520 from $0 \sim 2^n-1$ in succession, and if the control signal 'Sel' selects the column direction address, the multiplexer 530 selects a second bitstream of the column direction received from the counter 520 in an order of '0', $2^n$, $2 \times 2^n$, $3 \times 2^n$, $4 \times 2^n$, $5 \times 2^n$, $6 \times 2^n$, - - - , $2^{2n}-1$.

Figures 7, 8:
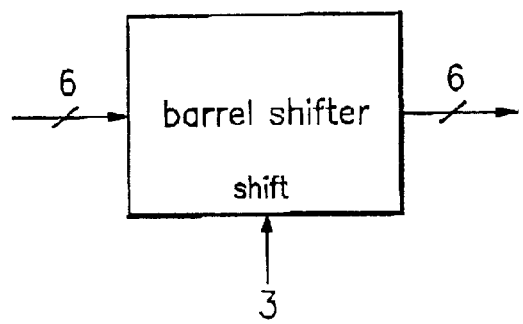
FIG. 7 is a diagram that illustrates a transposing memory of 8×8 size for generating a memory address according to the present invention.
FIG. 8 is a diagram that illustrates a system including a barrel shifter when a preferred embodiment of a device that generates a memory address in accordance with the present invention is applied to a square transposing memory with n=3.
Figure 9:
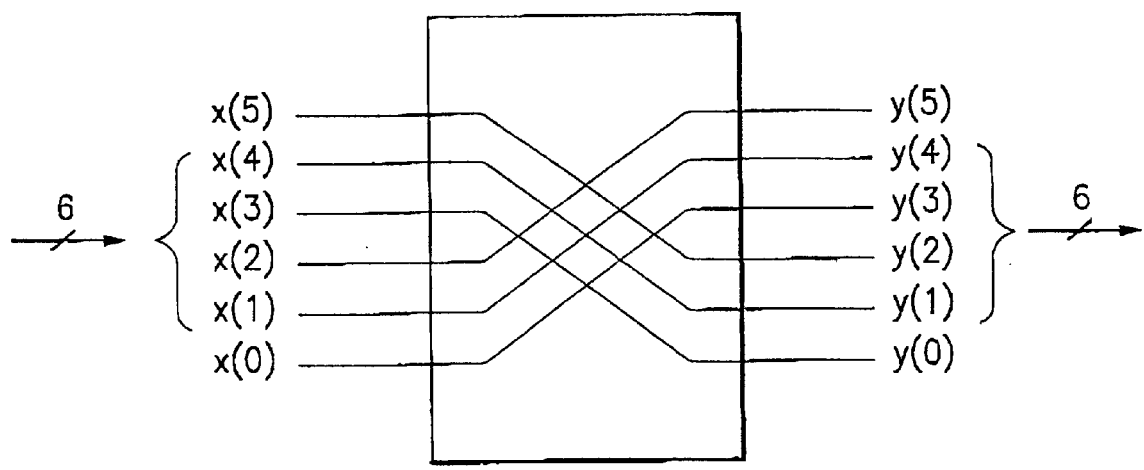
FIG. 9 is a diagram that illustrates operations of a barrel shifter when a preferred embodiment of a device that generates a memory address in accordance with the present invention is applied to a square transposing memory with n=3.

Operations of devices for generating a memory address in accordance with the first or second preferred embodiments of the present invention will now be described. FIG. 7 illustrates a transposing memory of 8×8 size with which operations of a device for generating a memory address according to preferred embodiments will be described. FIG. 8 illustrates a system of a barrel shifter when a device for generating a memory address in accordance with the first preferred embodiment is applied to a square transposing memory with n=3, and FIG. 9 illustrates operations of a barrel shifter when a device for generating a memory address in accordance with the first preferred embodiment of the present invention is applied to a square transposing memory with n=3. A device for generating a memory address according to preferred embodiments of the present invention is applicable both to the writing address generator and the reading address generator for the transposing memory. In addition, the row direction writing address and the column direction reading address can be generated with a difference of time and preferably parallel processing. In such concurrent generation, directions of writing and reading are exchanged after one entire period of addresses are generated. Operations of the devices for generating a memory address according to preferred embodiments will be described assuming a case when the device is applied to a transposing memory of $2^3 \times 2^3$ size (i.e., n=3).

The device for generating a memory address according to the first or second preferred embodiments can use outputs of the counter 500, which increase step by step from 0 to 63, or the first bitstream of the counter 520 as the row direction addresses, and when stored data in the transposing memory is read, use outputs of the barrel shifter 510, which are the 6 bit bitstreams generated at the counter 500 each shifted by 3 bits, or the second bitstream of the counter 520 as the column direction addresses. For example, if the counters generate a bitstream of '000001' of 6 bits corresponding to '1', the barrel shifter 510 or the second bitstream subjects the bitstream to barrel shifting to generate '001000' corresponding to '8'. Then, the transposing memory forwards data in the column direction according to addresses of '0', '8' and '16' generated at the device for generating a memory address. The barrel shifter 510 can also be realized through bit ordering. The barrel shifter 510 can be realized based on hardware by exchanging a most significant 3 bits and a least significant 3 bits of the parallel 6 bit addresses received in the row direction. Thus, desired addresses, i.e., addresses increasing step by step in the column direction can be generated.

Figure 10:
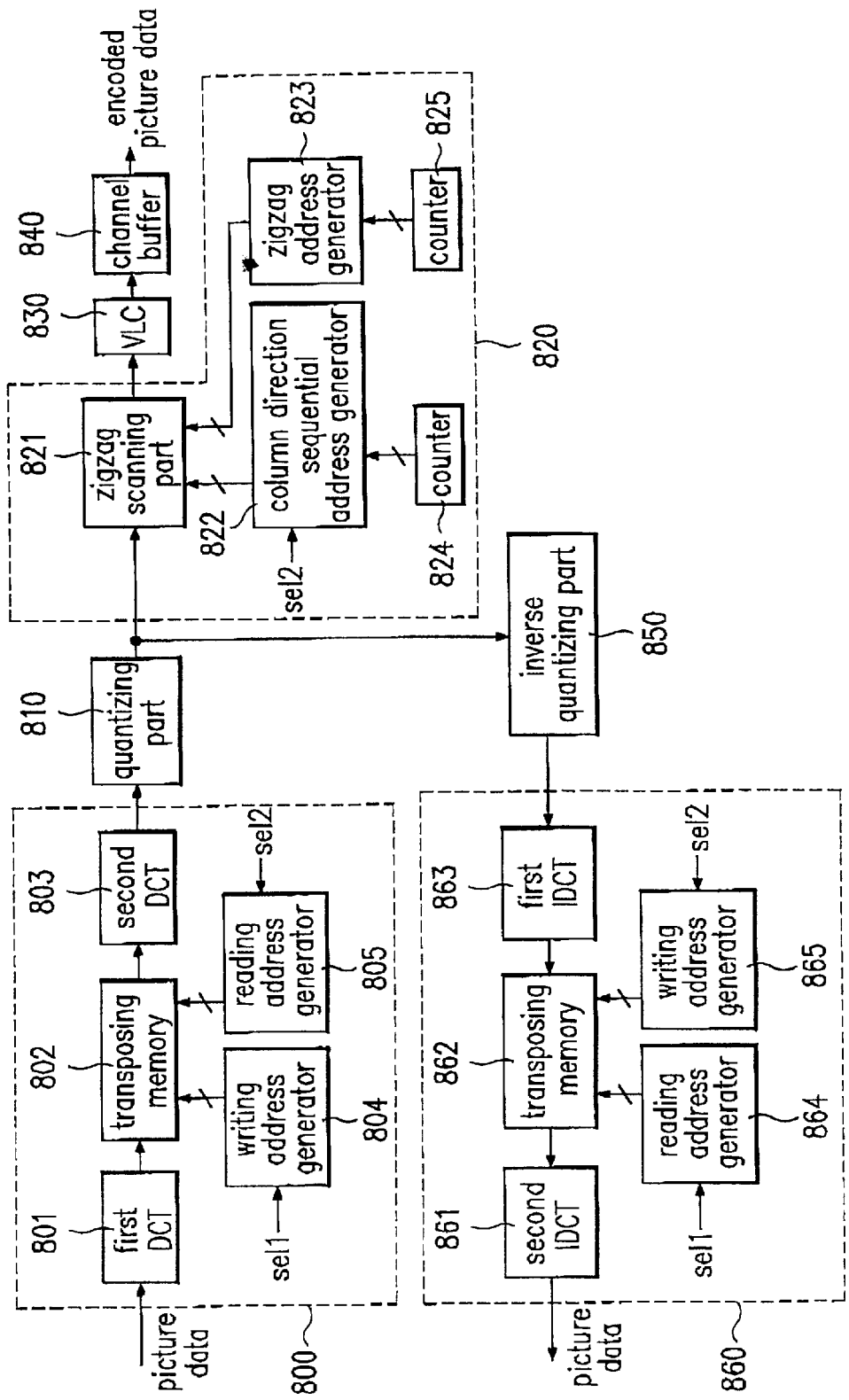
FIG. 10 is a diagram that illustrates a part of an encoder in a mobile station in accordance with preferred embodiments of the present invention.

Preferred embodiments of a picture encoder in a mobile station and an interleaver of a mobile communication system using a device for generating a memory address according to the present invention will now be described. FIG. 10 is a diagram that illustrates a part of a preferred embodiment encoder in a mobile station. The preferred embodiment of an encoder can use the first and second preferred embodiments of a device that generates a memory address in accordance with the present invention.

As shown in FIG. 10, the preferred embodiment of the encoder in a mobile station that generates a memory address includes a 2D DCT part 800 for receiving, and twice subjecting a picture data to DCT, a quantizing part 810 for receiving and quantizing the picture data from the DCT part 800 and a zigzag scanning block 820 for scanning DC and AC components of the picture data quantized at the quantizing part 810 in a zigzag for encoding the DC and the AC components. A VLC part 830 is for assigning codes of short lengths to symbols with high frequency of occurrences in view of probability, and assigning codes of long lengths to symbols with low frequency of occurrences to encode symbols from the zigzag scanning block 820. A channel buffer 840 buffers the encoded picture data. An inverse quantizing part 850 is for subjecting the DCT data from the quantizing part 810 to inverse quantizing, and a 2D IDCT part 860 is for subjecting the DCT data from the inverse quantizing part 850 to IDCT.

The transposing memory 802 in the 2D DCT part 800, the zigzag scanning block 820, and the transposing memory 862 in the 2D IDCT 860 have memory address generators according to preferred embodiments of the present invention. The 2D DCT part 800 includes a first DCT 801 for receiving and subjecting the picture data to DCT, a transposing memory 802 for storing the DCT picture data in a row direction or column direction and presenting in the row direction or the column direction and a second DCT 803 for subjecting the data from the transposing memory 802 to DCT. A memory writing address generator 804 generates a writing address of the transposing memory 802, and a memory reading address generator 805 generates a reading address of the transposing memory 802. The 2D IDCT part 860 includes a first IDCT 863 for receiving and subjecting the DCT data from the quantizing part 810 to IDCT, a transposing memory 862 for temporary storing the IDCT data in the row direction or in the column direction and presenting in the column direction or in the row direction and a second IDCT 861 for subjecting the data from the transposing memory 862 to IDCT. A memory writing address generator 865 generates a writing address of the transposing memory 862, and a memory reading address generator 864 for generating a reading address of the transposing memory 862.

The zigzag scanning block 820 includes a zigzag scanning part 821 for making zigzag scanning of the quantized data, a column direction address generator 822 and a zigzag address generator 823 for providing a scanning and an output address to the zigzag scanning part 821, respectively. As described above, the respective address generators 804, 805, 864, 865, 822, and 823 are preferably memory address generators according to the first and second preferred embodiments of the present invention.

Figure 11:
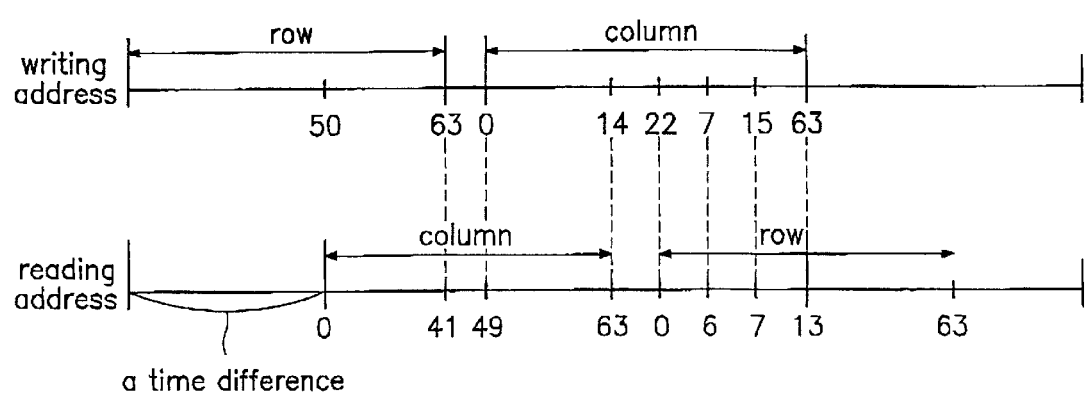
FIG. 11 is a diagram that illustrates parallel processing of writing addresses and reading addresses at preferred embodiments of a device that generates a memory address in an encoder according to the present invention.

Operations of the preferred embodiment of the encoder will now be described. FIG. 11 is a diagram that illustrates parallel processing of writing address and reading address at a device for generating a memory address by generating a writing address and a reading address at the same time in the preferred embodiment of the encoder.

A picture data provided to the 2D DCT part 800 is subjected to a first DCT, and temporarily stored in the transposing memory 802. The memory address generator 804 generates a bitstream of bits from '0' to '63' as writing addresses. That is, either the bitstream from the counter 500 in FIG. 5, or the first bitstream in FIG. 6 can be used as writing addresses. The memory reading address generator 805 preferably starts to generate the reading address for address '0' at a time the memory writing address generator 804 generates the writing address for address '50' (110010). Accordingly, the memory reading address generator 805 generates the column direction reading address for address 41 (101001) at the time the memory writing address generator 804 generates the writing address for a last address of 63 (111111). As the column direction addresses, either the bitstream from the barrel shifter 510 in FIG. 5 or the second bitstream in FIG. 6 can be used. The memory writing address generator 804 generates the column direction writing address for address '0' at the time the memory reading address generator 805 generates the column direction reading address for address 49. In continuation, the memory writing address generator 804 subsequently generates the column direction writing address for address '14' at the time the memory reading address generator 805 generates the column direction reading address for address 63. Similarly, the memory writing address generator 804 generates the column direction writing address for address '22' at the time the memory reading address generator 805 generates the row direction reading address for address 0.

Thus, after generating one period of row direction writing addresses, the memory writing address generator 804 of the present invention generates the column direction writing addresses in the next period. Similarly, upon finishing generation of one period of column direction addresses, the memory reading address generator 805 generates a row direction reading addresses in the next period. As described above, the row direction addresses can be selected by selecting the bitstreams generated at the counter 500 in a case of the memory address generator in FIG. 5, and then in the next period the row direction addresses can be selected by selecting the bitstreams from the barrel shifter 510. In using a memory address generator as shown in FIG. 6, if the multiplexer 530 is made to select the first bitstream from the counter 520, the row direction addresses can be selected, and if the multiplexer 530 is made to select the second bitstream from the counter 520, the column direction addresses can be selected.

In addition, the picture data may be provided to, and forwarded from the zigzag scanning part 821 and the transposing memory 862 in the case of the zigzag scanning block 820 and the 2D IDCT 860 by the same method described above. Thus, a detailed description is omitted here. Further, as a decoder has a system opposite to the encoder, preferred embodiments of the memory address generator can be applied to the decoder the same manner as the encoder. Thus, a detailed description is omitted here.

As described above, since the same memory address generator according to preferred embodiments of the present invention can generate the row direction or the column direction addresses and data writing/reading to/from the transposing memory in the encoder having the memory address generator applied thereto can alternate between column and row, the memory address generator can be simplified, an efficiency of memory use can be increased, and operation time period can be reduced.

Figure 12:
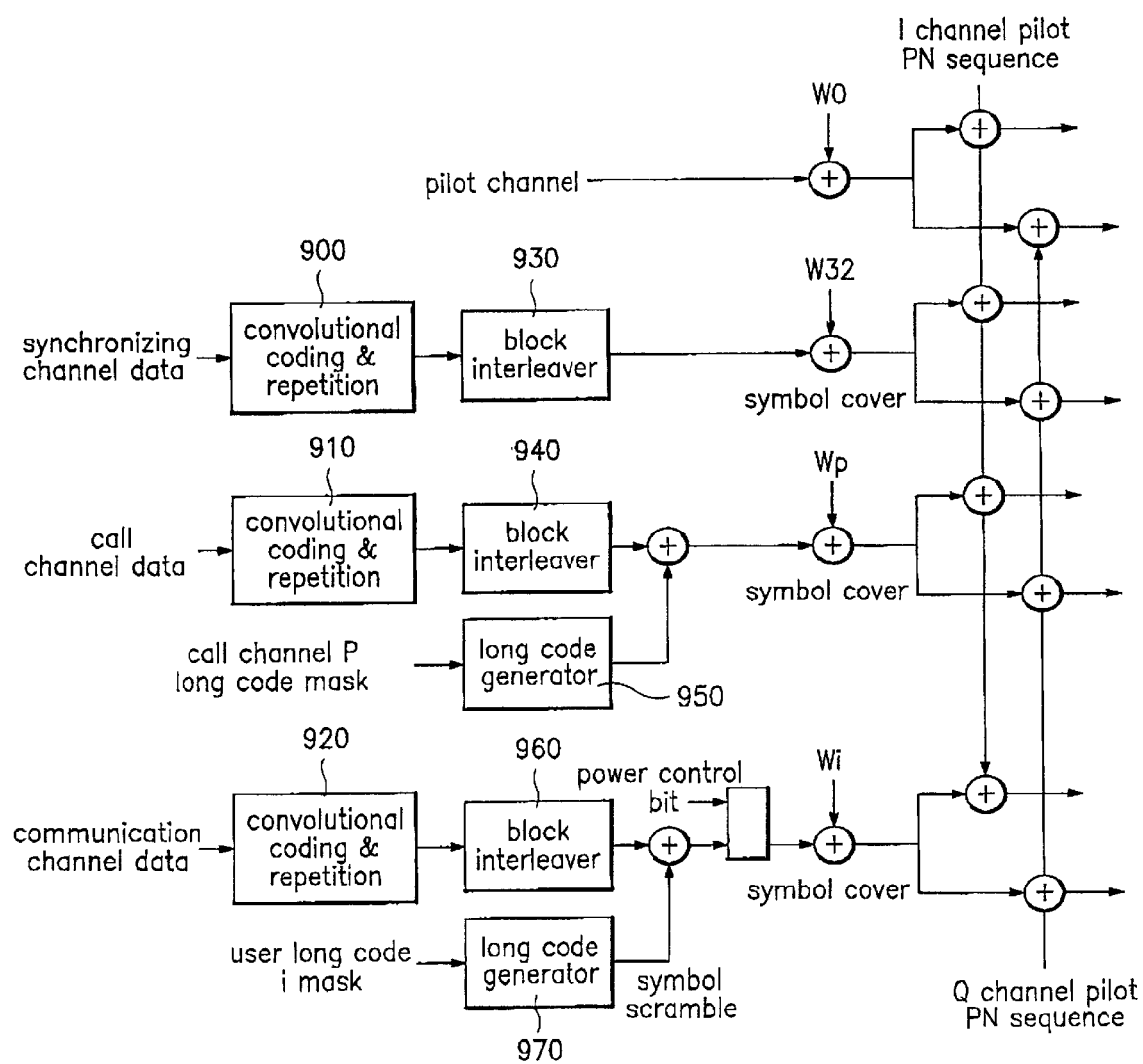
FIG. 12 is a diagram that illustrates an interleaver in a mobile communication system in accordance with a preferred embodiment of the present invention.

A preferred embodiment of an interleaver in a mobile communication system having memory address generator according to the present invention will now be described. FIG. 12 is a diagram that illustrates an interleaver provided to a forward link in a mobile communication system in accordance with the preferred embodiment of the present invention.

As shown in FIG. 12, in the forward link of the mobile communication system, speech information to be transmitted is digitized by using a Pulse Code Modulation (PCM) and a vocoder (not shown), and subjected to convolutional coding 900, 910, and 920 repeatedly for respective channel (synchronizing channel, call channel, and access channel) data, so that the receiver can detect, and correct errors. The data coded by the convolutional codings 900, 910, and 920 is rearranged at interleavers 930, 940, and 960 so that the data can endure in fast fading in a radio interval. Then, the data from respective channels are scrambled by PN sequences and modulated at modulation terminals (not shown) for transmission. The interleavers 930, 940, and 960 have memories for temporary storage of data received through respective channels, and thus, preferred embodiments of the memory address generators and methods may be used for writing/reading data to/from the memories. If it is assumed that the interleavers 930, 940 and 960 memory have a size of $2^n \times 2^n$, a memory writing address generator generates the row direction sequential addresses and writes the data on the memory, and the memory reading address generator generates a column direction address when a data is written at a predetermined address to forward the stored data in the column direction. In a next period, the memory writing address generator forwards the writing addresses in the column direction, and the memory reading address generator forwards the reading address in the row direction. The forgoing process can be repeated.

As described above, preferred embodiments of a device for generating memory addresses, a mobile station by using the same, and a method for writing/reading a data have various advantages. Since addresses can be generated in a desired direction (e.g., row or column direction) without using a plurality of counters and accumulators, preferred embodiments of the device for generating a memory address can simplify a hardware system of a picture encoder/decoder in a mobile station, or of interleavers in a mobile communication system. Further, as the same memory address generator can be used both for the memory writing address generator and the memory reading address generator, the memory address generator is economical. Since preferred embodiments of methods for writing/reading to/from a memory of the present invention permits simultaneous writing and reading, operation speed is faster, and a memory analyzing performance is excellent.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A mobile station for encoding and transmitting a picture data, comprising:
    a transposing memory that stores the picture data in a matrix formed of addresses in both a row direction and a column direction;
    a memory writing address generator that alternately generates a writing address in the row direction of the transposing memory and generates a writing address in the column direction of the transposing memory in response to a first control signal; and
    a memory reading address generator that alternately generates a reading address in the column direction of the transposing memory and generates a reading address in the row direction of the transposing memory in response to a second control signal.

2. The mobile station of claim 1, wherein each of the generators comprises:
    a counter that generates 'm' bit addresses in succession; and
    a barrel shifter that shifts the successive 'm' bit addresses by 'n' bits to provide the writing and reading addresses.

3. The mobile station of claim 2, wherein 'm' is equal to 2n.

4. The mobile station of claim 1, wherein each of the generators comprises:
    a counter that generates $2^{2n}$ addresses in succession to provide a first 2n bitstream and generates a second 2n bitstream having the first 2n bitstream shifted by 'n' bits; and
    a multiplexer that selects one from the first 2n bitstream and the second 2n bitstream in response to a selection signal.

5. The mobile station of claim 1, wherein each of the generators comprises:
    a counter that generates a plurality of addresses with a prescribed number of bits in succession to provide row addresses; and
    a shifter that shifts the successive prescribed bit addresses by 'n' bits to provide column addresses.

6. The mobile station of claim 5, wherein the addresses are for a memory of $2^n \times 2^n$ size, wherein the prescribed number of bits is 2n, wherein the successive memory addresses are $2^{2n}$ in number, and wherein a first column address corresponds to a fiftieth (50) row address.

7. The mobile station of claim 5, wherein the shifter comprises a multiplexer that selects one from the row addresses and the column addresses in response to a selection signal, wherein the column addresses are shifted by rearranging the prescribed number of bits of the row addresses.

8. The mobile station of claim 5, wherein the counter comprises:
    a first output terminal that outputs a 2n bitstream; and a second output terminal that outputs the 2n bitstream with positions of a most significant 'n' bits and a least significant 'n' bits exchanged.

9. The mobile station of claim 5, wherein an initial one of the column addresses is generated by shifting a selected one of the row addresses.

10. The mobile station of claim 1, wherein the transposing memory comprises a prescribed number of cells, wherein the prescribed number is $2^{2n}$.

11. The mobile station of claim 10, wherein the transposing memory has a $2^n \times 2^n$ size.

12. The mobile station of claim 1, wherein the transposing memory stores a first periodic data in the row direction in succession, outputs the first periodic data in the column direction in succession beginning when a preset number of the first periodic data are stored in the row direction, stores a second periodic data in the column direction in succession, and outputs the second periodic data in the row direction in succession.

* * * * *